United States Patent [19]
Sibley et al.

[11] 4,371,502
[45] Feb. 1, 1983

[54] CRYSTAL GROWING FURNACE PULLING HEAD

[75] Inventors: Clifton B. Sibley, Needham; Robert P. Bell, Wellesly, both of Mass.

[73] Assignee: Ferrofluidics Corporation, Nashua, N.H.

[21] Appl. No.: 249,196

[22] Filed: Mar. 30, 1981

Related U.S. Application Data

[63] Continuation of Ser. No. 119,913, Feb. 8, 1980, abandoned.

[51] Int. Cl.³ ............................................. C30B 15/32
[52] U.S. Cl. ............................. 422/249; 156/DIG. 98
[58] Field of Search ................. 156/617 SP, DIG. 98, 156/618; 422/249

[56] References Cited

U.S. PATENT DOCUMENTS

| 1,364,895 | 1/1921 | Slinglutt | 156/617 SP |
| 2,753,280 | 7/1956 | Moore | 156/617 SP |
| 3,194,637 | 7/1965 | Longini et al. | 156/617 SP |
| 3,511,609 | 5/1970 | Kato | 156/617 SP |

Primary Examiner—Hiram Bernstein
Attorney, Agent, or Firm—Richard P. Crowley

[57] ABSTRACT

A pulling head for a Czochralski type crystal growing furnace includes a ball linked chain for suspending the growing crystal ingot, a sprocket for engaging such chain to pull the ingot from a melt, motor means for driving the sprocket and a chain storage means to receive untensioned chain discharged from the sprocket.

14 Claims, 3 Drawing Figures

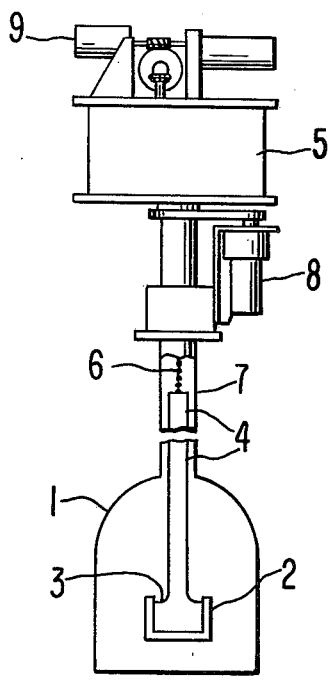
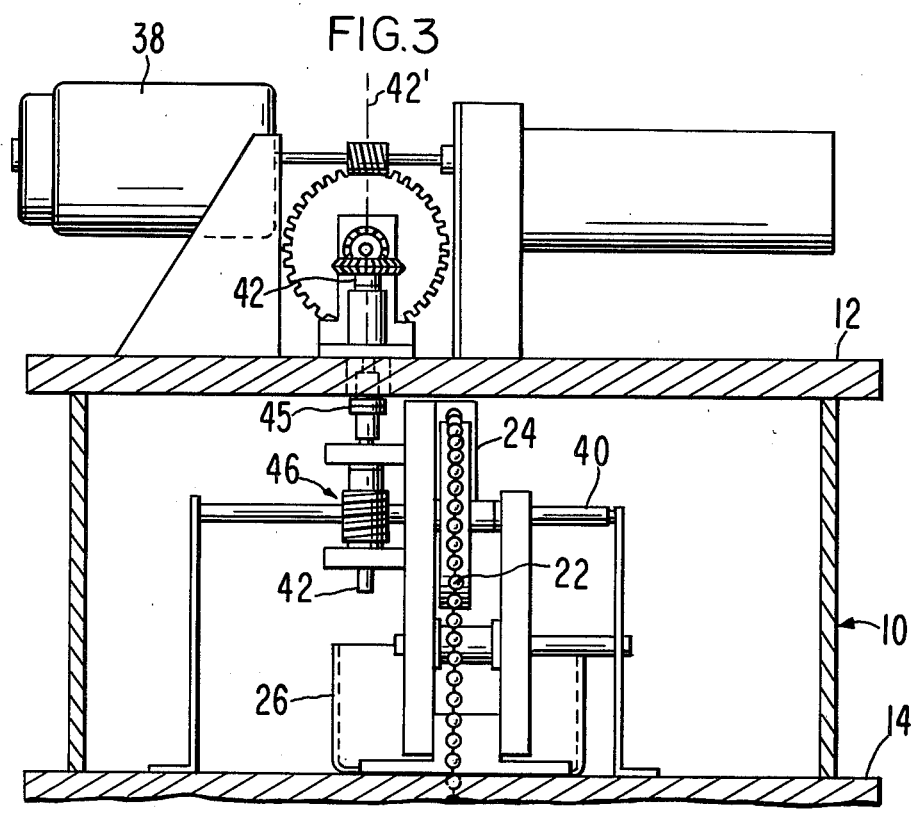

250,371,502

CRYSTAL GROWING FURNACE PULLING HEAD

This is a continuation of application Ser. No. 119,913, filed Feb. 8, 1980 (now abandoned).

FIELD OF THE INVENTION

The invention is in the field of apparatus for drawing single crystal ingots from a melt and more particularly relates to a pulling head for a Czochralski crystal growth apparatus.

The government has rights in this invention pursuant to Contract No. JPL 954884 awarded by the U.S. Department of Energy.

BACKGROUND OF THE INVENTION

Apparatus for the growth of single crystal ingots by the Czochralski method includes a crucible to contain a melt and a mechanism for concurrently drawing a crystal from the melt along a vertical axis at a steady rate while providing relative rotation about this axis for the growing crystal with respect to the melt. Vertical lift of the crystal ingot is effectuated from the "pulling head" portion of the apparatus which must maintain mechanical alignment of the axis of rotation with the vertical pulling axis while providing case of access for maintainence and rapid turnaround time in a production context. Moreover, in one class of apparatus it is desirable to carry out the process in a vacuum tight housing in order to obtain improved freedom from contamination.

It is known in the prior art to employ a ball chain and takeup drum for vertically lifting the crystal as it is drawn from the melt. In the known apparatus the alignment of the pulling axis, gravitationally defined by the ball chain, with the rotation axis is maintained by causing the takeup drum to travel along a lead screw, transverse to the crystal pulling rotation axis.

The known drum translation apparatus employes a keyed or splined mechanism, or linear ball bushing to constrain the drum translation to its rotational axis during rotation of the drum. A fixed nut and lead screw on the axis of the drum have such a thread pitch to translate the drum by an amount equal to the width of the chain. Thus, the chain is maintained tangent with the drum circumference and in constant alignment with the desired crystal rotation axis. The lubrication requirements for the lead screw and spline of the known chain pulling mechanism is clearly ill-suited to contain a contamination-free environment desired for crystal growth with the present invention.

The transverse travel requirement for the drum of the prior art mechanism further enlarges the volume of the pulling head and affects the balance of the mechanism which controls rotation about the vertical axis. The winding of the chain on the drum is a source of uneven lift as the chain increments relax against the drum surface while under tension. Such relaxation occurs in an uncontrolled fashion and small irregularities in vertical pulling are introduced thereby.

Crystal pulling apparatus of the form above described utilizes a chain taking the form of a linkage of spherical beads. This arrangement has a number of advantageous properties but the chain must be replaced at moderately frequent intervals of use. In the prior art one end of the chain is secured to the drum directly via mechanical fastener. Consequently the entire chain must be replaced as a routine preventative maintenance measure requiring that the pulling head chamber be opened for access.

BRIEF DESCRIPTION OF THE INVENTION

An object of the present invention is the provision, in a crystal growing furnace of the Czochralski type, for a pulling head which is compact while effectuating long pull lengths.

Another object of the present invention is the provision of a pulling head for a Czochralski type crystal growth apparatus which exhibits superior properties of stability and control for maintaining uniform rotational and vertical motions of the growing crystal ingot.

In one feature of the invention, the growing crystal is suspended by beaded chain and pulling is accomplished with a sprocket adapted to such chain, said sprocket discharging chain into a bin.

In another feature of the invention the lateral surfaces of the sprocket are adapted to conform to the shape of the chain beads by the formation of pockets in such lateral surface.

In yet another feature of the invention, excess chain is accommodated which permits routine discard of a portion of thermally exposed chain in preparation for new crystal growth.

These objects and features are realized by separating the vertical actuation of the chain and chain take-up through provision of a sprocket for the vertical pulling function and a simple container for the storage of untensioned chain. The sprocket engaging the chain is characterized by concave pockets forming the sprocket teeth, such pockets conforming to the spherical shaped beads of the ball chain. As a result of this configuration, the pulling function is executed more smoothly.

Chain takeup is accomplished by discharge of the free end of the chain from the sprocket into a container thereby eliminating the need for a traveling alignment mechanism synchronized with a rotating takeup means.

BRIEF DESCRIPTION OF THE FIGURES

FIG. 1 shows schematically a crystal pulling system incorporating the present invention.

FIG. 3 is another view of a part of the mechanism of FIG. 2.

DETAILED DESCRIPTION OF THE INVENTION

Figure 2:
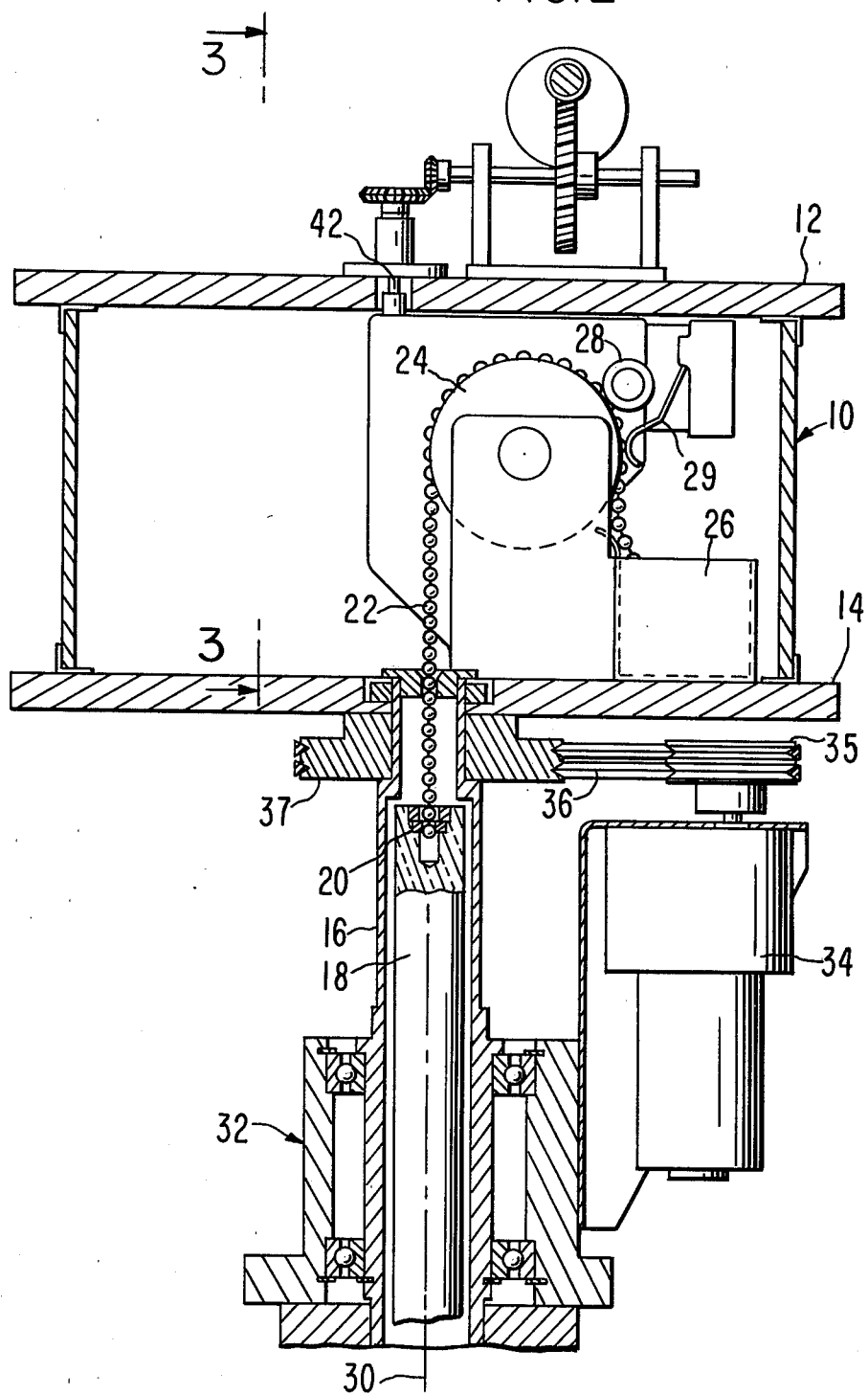
FIG. 2 is a partially schematic view of the pulling head of the present invention.

A crystal growing system incorporating the present invention is outlined briefly in FIG. 1. A furnace 1 heats a crucible 2 of refractory material (ordinarily quartz) to maintain a melt 3 of the feedstock of the desired crystal material. A crystal 4 is pulled from the melt 3 by pulling head 5 through linkage 6. A housing 7 surrounds the entire apparatus to maintain freedom from contaminants and in some instances to provide hermetic envelope to support a vacuum or inert atmosphere within. Motors 8 and 9 provide relative rotational and pulling motions of the ingot with respect to the melt.

The invention is best described with the aid of FIG. 2 which shows the salient components of the pulling head. A housing 10, preferably formed of a transparent material, is closed on both ends by top plate 12 and bottom plate 14 to form the pulling head enclosure. The bottom plate 14 communicates with the vertical column 16 of the full crystal growing system. A growing crystal 18 drawn from a melt, not shown, is supported from a seed holder 20 supported by the beaded chain or ball chain 22. Ball chain 22 may be formed of a plurality of hollow spherical members, loosely linked to adjacent like members by rod or tubular dumbell shaped segments. The ball chain 22 engages sprocket 24 and the untensioned or free end of ball chain 22 is discharged from sprocket 24 to collect in container 26. Sprocket 24 is formed from a cylindrical section, the curved surface of which has pockets formed in such surface to accommodate the links of the ball chain 22. In order to assure enough wrap around sprocket 24 to support the weight of the growing crystal, an idler pulley 28 constrains the free end of ball chain 22 to sprocket 24. Switch actuator 29 senses an end-of-chain condition. This assures the desired feeding of the free end of ball chain 22 to feed the seed into the melt. It is apparent that a portion of the interior volume of the pulling head chamber may serve as a collecting volume in lieu of container 26.

The entire pulling head is adapted for rotation about vertical axis 30 through bearing assembly 32. Fixed motor 34 drives the entire pulling head through motor pulleys 35, belts 36 and head pulleys 37.

Vertical pulling power is provided by motor 38 through a transmission train schematically illustrated in FIG. 3. This transmission is conventional and provides a reduction appropriate to turn sprocket shaft 40 at rotational speeds in the range of 0.1 to 1.5 revolutions per hour. Further adjustment of pulling rate is obtained by choice diameter for sprocket 24. This has been selected to produce a circumference of 10 inches; the reduction ratios in cooperation with such sprocket diameter yields vertical pull rates in the range 1–15 inches per hour. Accordingly, rotational power is provided to shaft 42 on vertical transmission axis 42' through intermediate reduction gearing 44. Vertical shaft 42 is built in two portions with coupling 45 provided to permit simple removal of top plate 12 for access to the mechanism. Right angle drive 46, for example, a worm and worm-wheel set, provides further reduction gearing and transmits power to the sprocket shaft 40.

Whereas traveling drum pulling heads of the prior art employ a fixed length chain, the present apparatus uses variable length chain. the excess chain stored in container 26 permits frequent removal of a portion of chain proximate the seed holder. Because the strength of the chain is degraded by continuous exposure to high temperatures in this region, the likelihood of chain failure is minimized by routine removal of a portion of chain so exposed before initiating new crystal growth. The excess chain permits this routine practice. Chain failure, it will be noted, is a disasterous occurrence resulting in loss of an ingot grown at great expense, likely damage to the crucible and hot zone components considerable amount of time to restore the condition of the apparatus. This excess chain feature in unavailable on known traveling drum pulling heads because the upper end of the chain in such apparatus is secured to the drum to sustain a correlation between the rotation of the drum pulling axis and ingot altitude on such axis. Another simple embodiment of the principle here described would utilize a drum or other spooling means in lieu of the sprocket with sufficient wraps of suspending medium to obtain a frictional stabilization of the load. The untensioned length of suspending medium, whether chain or cable, would be discharged into a portion of the apparatus envelope.

Since many changes could be made in the described construction and many apparently widely different embodiments of this invention could be made without departing from the scope thereof, it is intended that all matter contained in the above description or shown in the accompanying drawings shall be interpreted as illustrative and not in a limiting sense.

We claim:

1. A Czochralski-type crystal-growing furnace apparatus for drawing a crystal from a melt, which apparatus comprises:
   (a) crucible means for containing a melt from which a crystal is to be drawn;
   (b) pulling-head means for drawing a crystal along a vertical axis from the melt in the crucible means;
   (c) means to provide relative rotation about the vertical axis between the melt and the crystal drawn therefrom;
   (d) seed-holder means for securing a seeded crystal drawn from the melt;
   (e) chain means having a plurality of flexibly coupled links, the chain means having a one end and another free end, the chain means secured at the one end under tension to the seed-holder means and adapted to move the seed-holder means along the vertical axis;
   (f) take-up means in cooperative engagement with the chain means, to move the seed-holder means and the seeded crystal grasped thereby along the vertical axis, which take-up means includes
      (i) sprocket means including teeth spaced along the periphery thereof to engage the chain links, said sprocket means disposed to align vertically oriented tangent from said sprocket means congruent with said vertical axis,
      (ii) means to rotate the sprocket means to move the chain means, so that the seed holder will move along a vertical axis, and
      (iii) containment means to receive or discharge the free, untensioned other end of the chain means, as the sprocket means drives the chain means along the vertical axis, raising or lowering the seed holder.

2. The apparatus of claim 1 wherein the chain means comprises a plurality of connected, generally uniform, spherical bead elements.

3. The apparatus of claim 1 which includes a chamber means surrounding the crucible means and the pulling-head means, to maintain a hermetically sealed environment for the drawing of a seeded crystal from the melt.

4. The apparatus of claim 3 wherein said containment means comprises a portion of the interior volume of said chamber means.

5. The apparatus of claim 1 wherein the containment means comprises an open bin container adapted to receive and store the untensioned free end of the chain means, as the seeded crystal grasped by the seed-holder means is pulled from the melt by the upward movement of the chain means along the vertical axis by the rotation of the sprocket means.

6. The apparatus of claim 1 wherein the sprocket means comprises a driven cylinder, wherein the chain means cooperatively engages a plurality of peripheral, circumferentially aligned pockets formed by said teeth on the surface of the cylinder means.

7. The apparatus of claim 1 wherein an intermediate portion of the chain means extends in a cooperative engagement with the pockets on the cylinder over an angular distance of about 180°.

8. The apparatus of claim 1 which includes an idler-pulley means disposed in a rotatable relationship from the sprocket means, to contain the untensioned free end of the chain means, as it passes from the sprocket means into the containment means.

9. The apparatus of claim 1 which includes a switch-actuating means between the sprocket means and the containment means, the switch-actuating means sensing an end-of-chain condition, as the chain means is moved along the vertical axis.

10. A Czochralski-type crystal-growing furnace apparatus for drawing a crystal from a melt, which apparatus comprises:
   (a) crucible means for containing a melt from which a crystal is to be drawn;
   (b) pulling-head means for drawing a crystal along a vertical axis from the melt in the crucible means;
   (c) means to provide relative rotation about the vertical axis between the melt and the crystal drawn therefrom;
   (d) seed-holder means for securing a seeded crystal drawn from the melt;
   (e) chain means having a plurality of flexibly coupled links comprising a plurality of connected, generally uniform, spherical bead elements, the chain means having a one end and another free end, the chain means secured at the one end to the seed-holder means and adapted to move the seed-holder means along the vertical axis;
   (f) a chamber means surrounding the crucible means and the pulling-head means, to maintain a hermetically sealed environment for the drawing of a seeded crystal from the melt; and
   (g) take-up means in cooperative engagement with the chain means, to move the seed-holder means and the seeded crystal grasped thereby along the vertical axis, which take-up means includes
      (i) sprocket means which comprises a driven cylinder including teeth spaced along the periphery and having a plurality of shaped pockets on the peripheral surface of the means, which shaped pockets of the teeth conform to the general shape of and are adapted to engage cooperatively at least a portion of the flexibly coupled links of the chain means, an intermediate portion of the chain means between the one and the other free end passing over the surface of the sprocket means and the flexibly coupled links in a cooperative tensioned engagement with the pockets on the surface, said sprocket means disposed to align a vertically oriented tangent from said sprocket means congruent with said vertical axis,
      (ii) means to rotate the sprocket means to move the chain means, so that the seed holder will move along a vertical axis, and
      (iii) containment means, which comprises a portion of the interior volume of said chamber means, to receive or discharge the free, untensioned other end of the chain means, as the sprocket means drives the chain means along the vertical axis, raising or lowering the seed holder.

11. A pulling-head device for use with a Czochralski-type, crystal-growing furnace for drawing a crystal, by means of a seed holder, from a melt contained in a crucible within a closed chamber, which pulling-head device comprises:
   (a) chain means having a plurality of flexibly coupled links, the chain means having a one end and another free end, the chain means secured at the one end to the seed-holder means and adapted to move the seed-holder means along the vertical axis; and
   (b) take-up means in cooperative engagement with the chain means, to move the seed-holder means and the seeded crystal grasped thereby along the vertical axis, which take-up means includes
      (i) sprocket means which comprises a driven cylinder including teeth spaced along the periphery and having a plurality of shaped pockets on the peripheral surface of the means, which shaped pockets of the teeth conform to the general shape of and are adapted to engage cooperatively at least a portion of the flexibly coupled links of the chain means, an intermediate portion of the chain means between the one and the other free end passing over the surface of the sprocket means and the flexibly coupled links in a cooperative tensioned engagement with the pockets on the surface, said sprocket means disposed to align a vertically oriented tangent from said sprocket means congruent with said vertical axis,
      (ii) means to rotate the sprocket means to move the chain means, so that the seed holder will move along a vertical axis, and
      (iii) containment means to receive or discharge the free, untensioned other end of the chain means, as the sprocket means drives the chain means along the vertical axis, raising or lowering the seed holder.

12. The device of claim 11 wherein the sprocket means comprises a driven cylinder, wherein the chain means cooperatively engages a plurality of peripheral, circumferentially aligned pockets on the surface of the cylinder.

13. The device of claim 11 which includes an idler-pulley means disposed in a rotatable relationship from the sprocket means, to contain the untensioned free end of the chain means, as it passes from the sprocket means into the containment means.

14. The device of claim 11 which includes a switch-actuating means between the sprocket means and the containment means, the switch-actuating means sensing an end-of-chain condition, as the chain means is moved along the vertical axis.

* * * * *